United States Patent [19]

Cooperman et al.

[11] Patent Number: 5,465,087
[45] Date of Patent: Nov. 7, 1995

[54] BROADBAND SWITCH

[75] Inventors: Michael Cooperman, Framingham; Arnold Paige, Natick; Richard W. Sieber, Attleboro, all of Mass.

[73] Assignee: GTE Laboratories Incorporated, Waltham, Mass.

[ * ] Notice: The term of this patent shall not extend beyond the expiration date of Pat. No. 5,285,202.

[21] Appl. No.: 193,819

[22] Filed: Feb. 8, 1994

(Under 37 CFR 1.47)

Related U.S. Application Data

[63] Continuation-in-part of Ser. No. 808,032, Dec. 11, 1991, Pat. No. 5,285,202, which is a continuation of Ser. No. 347,370, May 4, 1989, abandoned.

[51] Int. Cl.$^6$ ........................................... H04Q 1/00
[52] U.S. Cl. .................................. 340/825.8; 340/825.87; 340/825.02
[58] Field of Search ........................... 340/825.8, 825.79, 340/825.85, 825.87, 825.02, 826, 825.91; 370/112; 327/403, 407

[56] References Cited

U.S. PATENT DOCUMENTS

| | | |
|---|---|---|
| 3,614,327 | 10/1971 | Low . |
| 4,197,428 | 4/1980 | Semur . |
| 4,453,096 | 6/1984 | Le Can et al. . |
| 4,481,623 | 11/1984 | Clark . |
| 4,593,390 | 6/1986 | Hildebrand et al. . |
| 4,813,043 | 3/1989 | Reyneri . |
| 4,818,988 | 4/1989 | Cooperman et al. ............... 340/825.85 |
| 4,849,751 | 9/1989 | Barber et al. ....................... 340/825.02 |
| 4,970,507 | 11/1990 | Cooperman et al. ................ 340/825.8 |
| 5,049,877 | 9/1991 | Cooperman et al. ................ 340/825.8 |
| 5,285,202 | 2/1994 | Cooperman et al. ................ 340/825.8 |

FOREIGN PATENT DOCUMENTS

| | | |
|---|---|---|
| 396119 | 7/1990 | European Pat. Off. . |
| 2388447 | 11/1978 | France . |
| 60-201795 | 2/1986 | Japan . |
| 61-65623 | 8/1986 | Japan . |
| 1-158891 | 9/1989 | Japan . |

OTHER PUBLICATIONS

Hayno et al., "GaAs 8×8 Matrix Switch LSI for High–Speed Digital Communications," IEEE Gallium Arsenide IC Symposium, pp. 245–248 (Oct. 1987).
S. Whitaker, "Pass–Transistor Networks Optimize n–MOS Logic", Elec., vol. 56, No. 19, pp. 144–148 (Sep. 1983).
F. E. Barber et al., "Session IX: Telecommunication Circuits" IEEE Intl. Solid–State Circuits Conf. 1988 pp. 116–117.
Panzer et al., "Picture transmission path . . . subscriber network," Frequenz, vol. 38, No. 9 1984, pp. 217–223.
Suzuki et al., "A Circuit Design for . . . Switch LSI's," IEEE J. of Solid–State Circuits, vol. 25, No. 1, pp. 155–159 (1990).
IBM Tech. Disclosure Bull. "CMOS Self–Decoding Complementary Pass–Gate Multiplexer", vol. 28, No. 3 (Aug. 1985) pp. 1302–1303.
"Logic Design", Holdsworth et al., Wireless World, vol. 84, No. 1507, (Mar. 1978), PP. 47–50.
N. H. E. Weste et al., "CMOS Circuit and Logic Design," Prin. of CMOS VLSI Design, pp. 172–203 (1985).
Pasternak et al., "CMOS Differential Pass–Transistor Logic Design", IEEE Journal of Solid State Circuits, vol. SC–22 No. 2, pp. 216–222 (1987) Apr.

*Primary Examiner*—Donald J. Yusko
*Assistant Examiner*—Edwin C. Holloway, III
*Attorney, Agent, or Firm*—Victor F. Lohmann, III; James J. Cannon, Jr.

[57] ABSTRACT

A broadband space switch matrix includes a parallel combination of individual switch modules each comprising a cascade of pass-transistor selectors, NAND gates, and inverters arranged into a multi-stage tree multiplexing configuration. The switching speed is increased by isolating each switching crosspoint from the stray capacitive loading in the matrix.

4 Claims, 7 Drawing Sheets

BROADBAND SWITCH

CROSS-REFERENCE TO RELATED APPLICATIONS

The present application is a continuation-in-part of application entitled "BROADBAND SWITCH USING DEACTIVATED CROSSPOINTS FOR ESTABLISHING SWITCHING PATHS" filed Dec. 11, 1991 as Ser. No. 07/808,032 and issuing as U.S. Pat. No. 5,285,202 on Feb. 8, 1994, which is a continuation of Ser. No. 07/347,370, now abandoned, filed May 4, 1989 by the same inventors and assigned to the copending same assignee as the present application. The application is hereby incorporated by reference. This application is further related to U.S. Pat. No. 5,049,877, herein incorporated by reference.

FIELD OF THE INVENTION

This invention relates to telecommunications facilities and, more particularly, to a broadband switch.

BACKGROUND OF THE INVENTION

The source of speed limitations in conventional space switch arrays is illustrated by considering a K×J matrix including K inputs each of which can be connected to the J outputs by closing the switch at the intersection of an input/output line. The switches have associated stray capacitances that cause speed degradation. Therefore, the speed decreases as the size of the array is increased. For example, by closing a switch S11 at the intersection of row 1 and column 1, input 1 is connected to output 1. Even though inputs 2 to K are not connected, they contribute to the stray capacitance of column 1. Similarly, even though columns 2 to J are not connected, they contribute to the stray capacitance of row 1. It can be seen that input line 1 must charge (J−1)+(K−1) capacitors. The finite resistance in series with line 1 and column 1 forms an RC time constant that limits the speed of operation. As the array size is increased, this stray capacitance also increases and the speed continues to decrease.

The stray capacitance of the horizontal rows can be overcome by providing sufficient drive to the input lines. The most detrimental effect is caused by connections to the vertical lines. This is due to the fact that each of the switches at the crosspoints is implemented with an active circuit that must drive the vertical line and its associated capacitive loading. It does not help to make the active switch element larger so it can drive more capacitance because the stray capacitance increases in almost direct proportion to the size of the active switch.

SUMMARY OF THE INVENTION

The present invention relates to a switch comprising a plurality of switching means configured as a multistage tree-multiplexer wherein a first stage of said tree-multiplexer receives input signals, and a last stage includes a single switching means coupled to an output port; each of said switching means having a plurality of signal inputs, an output, and a control input means; each switching means in said first stage further comprises a pass-transistor selection means having a control input coupled to the respective control input means of said switching means, a plurality of signal inputs each coupled to receive a respective input signal, and an output; each of said selection means being responsive to said respective control input for selectively switching a signal from a selected one of said signal inputs to the output of said selection means; wherein the output of each switching means before the last stage drives a respective input of a switching means in the immediately following stage, and the output of the single switching means in said last stage is coupled to said output port; each of said switching means after the first stage being operable in a blocking state to force the output of said switching means to a predetermined steady-state logic value in response to a first control signal at the respective control input means; and each of said switching means after the first stage being operable in an unblocking state to selectably switch a signal from a selected input of said switching means to the output of said switching means in response to a second control signal at the respective control input means, and in response to output signals from switching means in the preceding stage which are in said blocking state.

In accordance with one aspect of the present invetion, each of said switching means after the first stage includes a NAND gate; said first control signal is a logical LOW state signal; said second control signal is a logical HIGH state signal; and said predetermined steady-state logic value is a HIGH state signal.

DETAILED DESCRIPTION OF PREFERRED EMBODIMENTS

Figure 1:
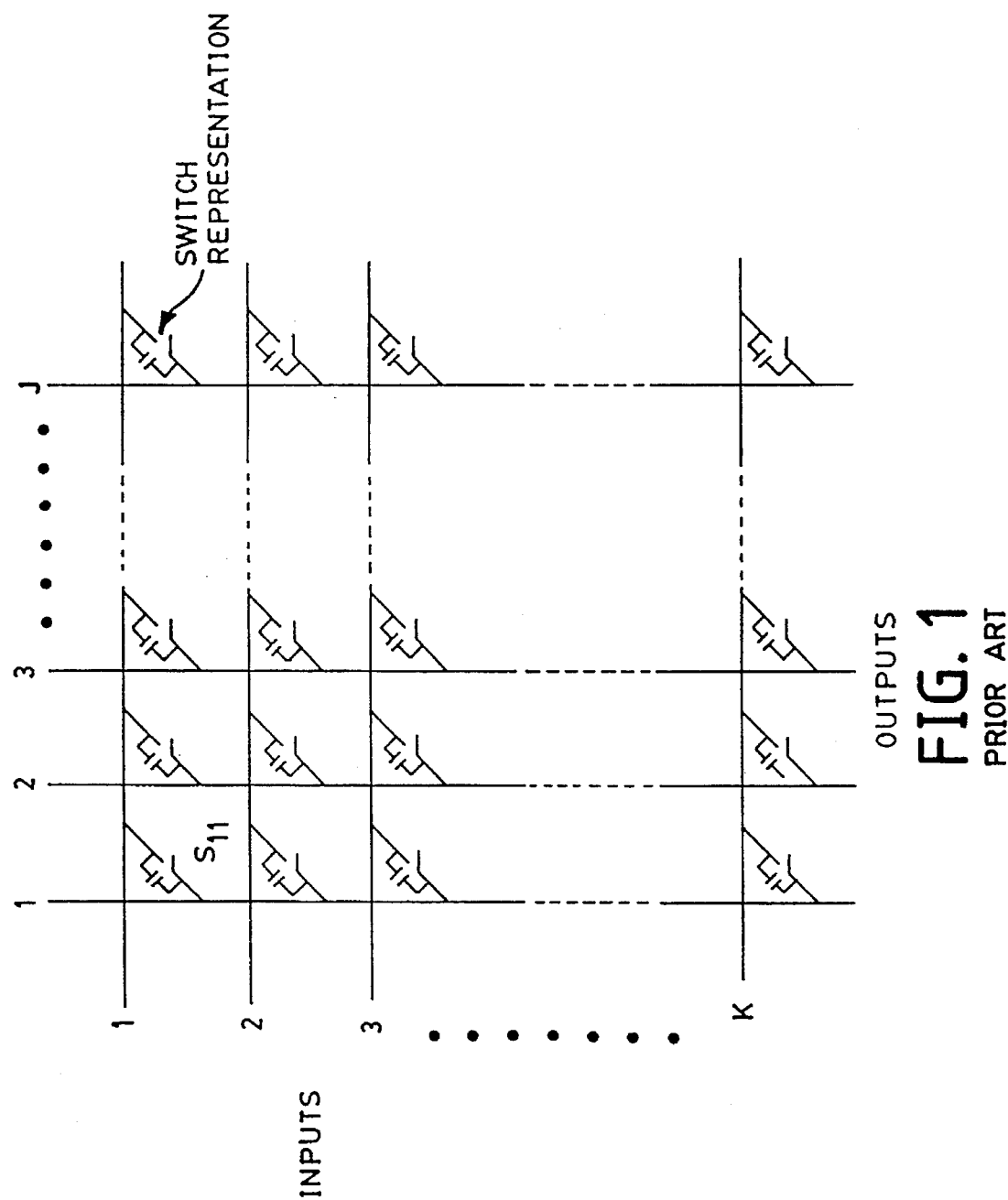
FIG. 1 is a circuit representation of a conventional space switch matrix.

FIG. 1 is a circuit representation of the conventional space switch matrix discussed supra in the Background of the Invention section. As indicated, each switch crosspoint at the intersection of a vertical and horizontal line contributes capacitance that limits the speed and size of the array.

Figure 2:
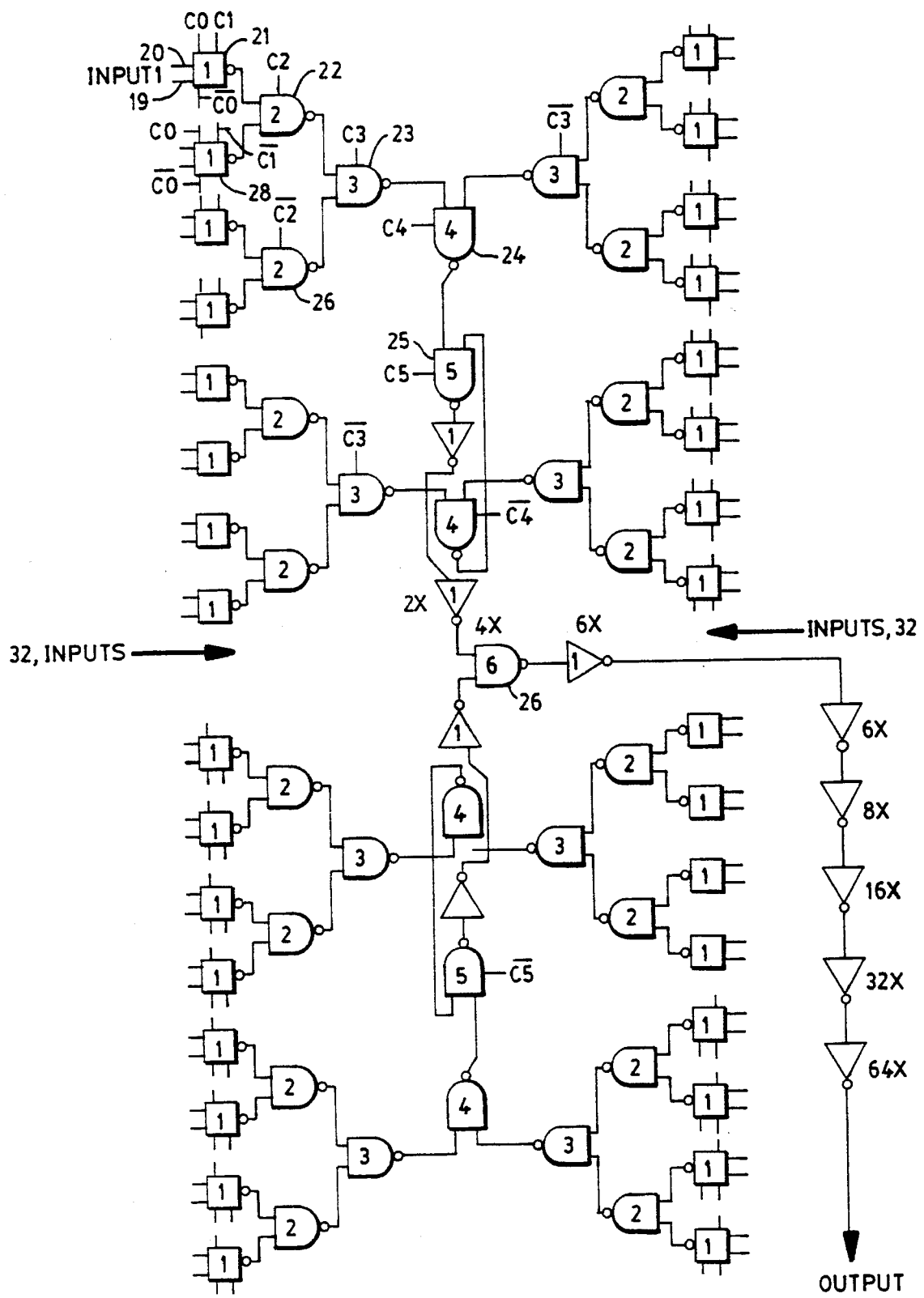
FIG. 2 is a circuit diagram of a switch module in accordance with a preferred embodiment of the present invention.

FIG. 2 is a circuit diagram of a 64×1 switch module in accordance with a preferred embodiment of the present invention. The 64×1 switch module is for illustrative purposes only and should not be construed as a limitation of the present invention, as it should be apparent to those skilled in the art that switch modules of varying dimensions may be designed according to the present invention following the principles discussed herein.

The switch module includes six (6) cascaded stages each performing controllable switching of signals from an input end to an output end which is then connected to an input end of a next stage. The circuit elements of the array each enclose a numeral identifying the relevant stage. The array comprises a stage no. 1 including pass-transistor selector elements 21, stages no. 2–6 each including NAND gate elements 22, and inverter elements coupled to certain NAND gate outputs.

The array is designed so that the output of each circuit element drives only one input of a circuit element in the next stage. For example, the output of each selector 21 in stage no. 1 drives a single input of NAND gate 22 in stage no. 2. Likewise, the output of NAND gate 22 drives a single input of a respective NAND gate 23 in stage no. 3. The selector element inputs are each coupled to receive a respective input signal from a corresponding input port. The array is operable in response to control signals C0 to C5 and their complementary values for switching a selected input signal through the array to the output port.

The true and complementary values of control signals C0–C1 serve as the control inputs for stage no. 1. The circuit elements (e.g., NAND gates) in the remaining stages no. 2–5 are each controlled by the true and complementary values of a single one of the control signals C2–C5. For example, the true and complementary values of control signal C2 control the switching in stage no. 2. The control is established within stages no. 2–5 such that for those gates in a stage whose outputs are coupled to respective inputs of the same NAND gate in the next stage, one of the NAND gates receives a true value of the control signal while the other NAND gate receives the complementary value. For example, since the outputs of NAND gates 22 and 26 are coupled to gate 23 in the next stage no. 3, gate 22 receives the true value of C2 while gate 26 receives the complementary value.

In stage no. 1, the switching occurs in the following manner. Each selector element 21 includes as control inputs the true and complementary value of control signal C0, and either the true or complementary value of control signal C1. As indicated, the output of each selector element is paired with the output of another selector element for supplying the input signals to the dual-input NAND gates in the next stage. For example, the outputs from selector elements 21 and 28 are coupled to respective inputs of NAND gate 22 in stage no. 2. However, these paired selector elements must be operable such that only one of the selector elements furnishes a data signal to the next stage no. 2.

The selector elements exhibit two levels of switching. For illustrative purposes only, assume that input signal 1 at input 20 of selector 21 is to be switched to the output of stage no. 6. First, the selector elements in stage no. 1 are responsive to the control signal C0 and its complementary value for initally selecting either the upper input 20 or lower input 19 for further switching. In particular, when C0=+5 V, all upper inputs are selected. The next level of switching is performed by control signal C1 such that when C1=+5 V and its complementary value equals 0V, all stage no. 1 selector elements allow the selected input to propagate to a corresponding NAND gate in stage no. 2, while the stage no. 1 selector elements connected to the complementary value of C1 are forced to a +5 V output value. The C1 control input connections in stage no. 1 are designed such that for paired selector elements, one of the selector elements receives the true value of C1 while the other receives the complementary value of C1. For example, selector 21 receives the true value of C1 while selector 28 receives the complementary value of C1.

For the stages no. 2–5, a +5 V signal level for the true values of control signals C2–C5 establishes a switching path along the bolded route through NAND gates 22, 23, 24, 25, and 26.

As illustrated in FIG. 2, each input port is connected to the output port via a cascade of selectors, NAND gates, and inverters. The high operational speed demonstrated by the switch module is based upon the particular interconnectivity between stages wherein each output drives only one corresponding input of a circuit element in a next stage.

The two inverters between stages 5 and 6 are used to prevent the connection between these two stages from becoming excessively long. The connection between stages is preferably limited to less than 200 μm, which is 0.015 pF in 3-μm technology. A direct connection between stages 5 and 6 would result in an 800 μm (0.06 pF) interconnection and reduce the speed.

Figure 3:
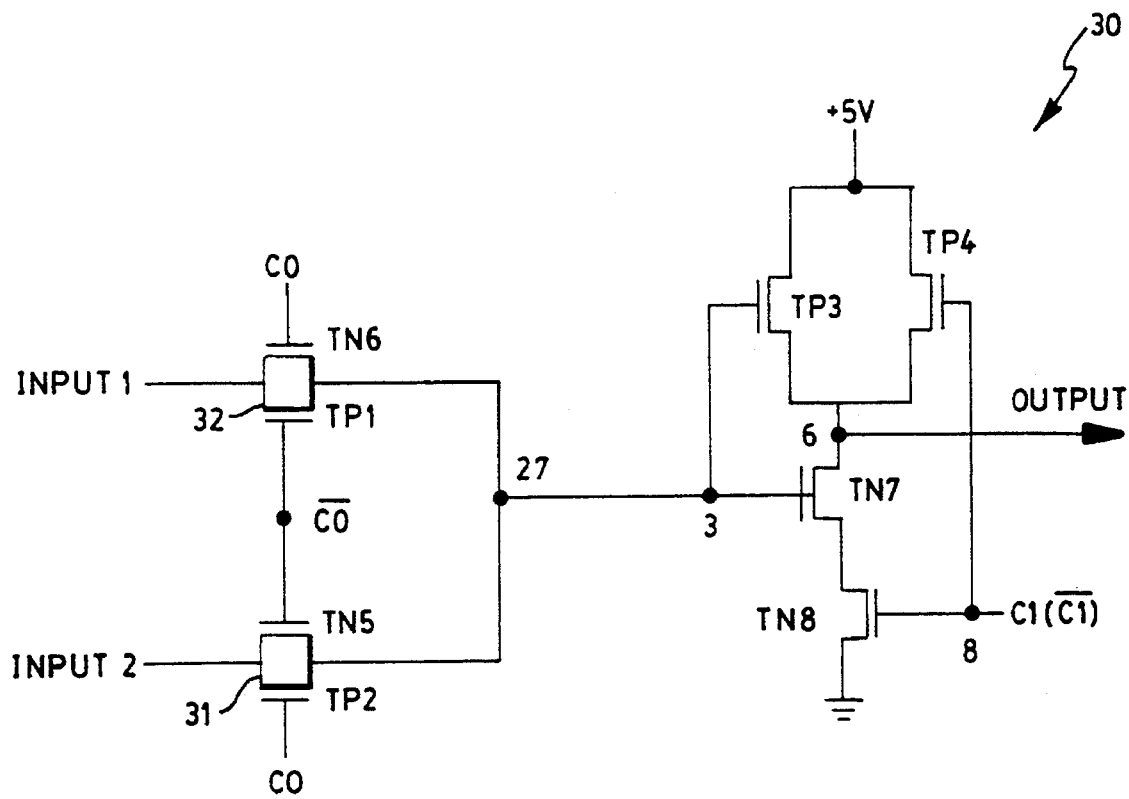
FIG. 3 is a circuit schematic of a selector circuit employed in the FIG. 2 switch in accordance with a preferred embodiment of the present invention.
Figure 4:
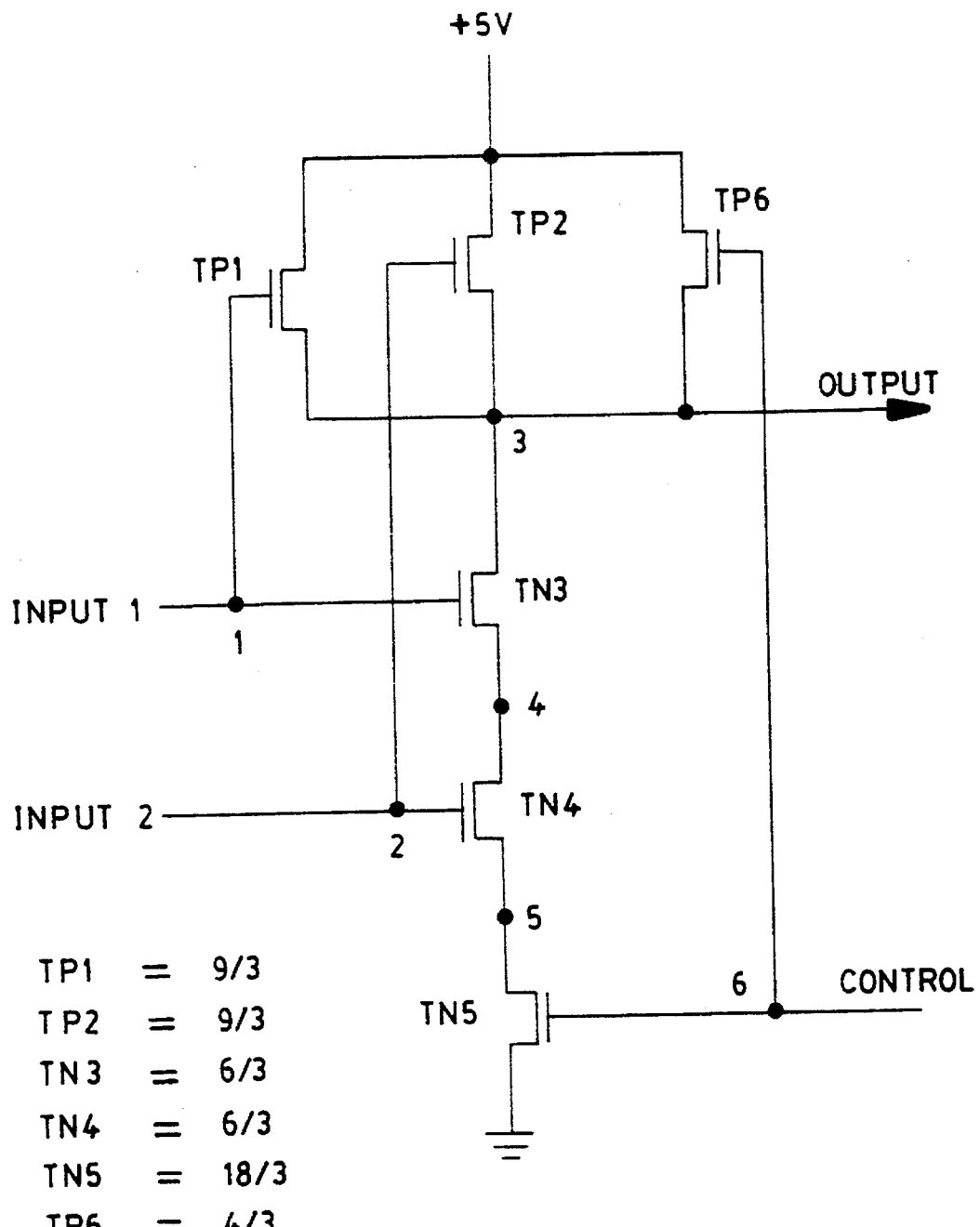
FIG. 4 is a circuit schematic of a NAND gate configuration employed by the present invention.
Figure 5:
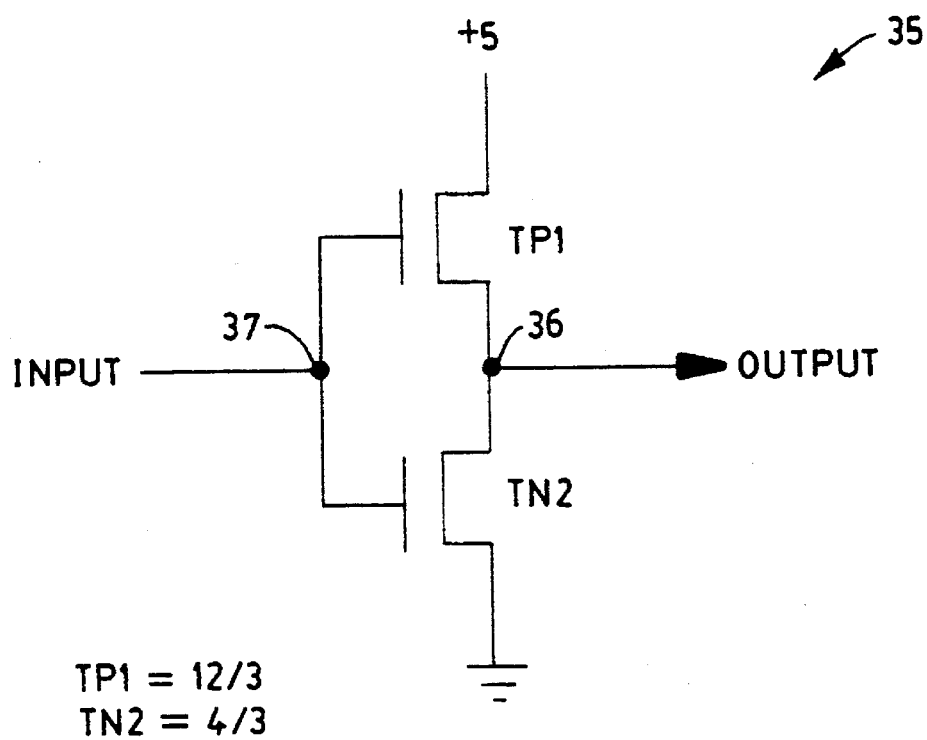
FIG. 5 is a circuit schematic of an inverter configuration employed by the present invention.

The following discussion relating to FIGS. 3–5 concerns a description of the various circuits employed in the switch module of FIG. 2. In the legend of FIGS. 3–5 is a chart of the width versus length (W/L) ratios of the transistors used in the relevant circuit element.

FIG. 3 represents a circuit schematic of each selector element in stage no. 1. The selector element employs a pass-transistor 33 for input selection, followed by a NAND gate 30 with an override control input. The selector element configuration includes a first switch 31 of a complementary pair of a P-type and an N-type MOS field effect transistor TP2 and TN5, respectively, connected in parallel between input connection 2 and a common juncture 27. A second switch 32 of a complementary pair of a P-type and an N-type MOS field effect transistor TP1 and TN6, respectively, are connected in parallel between input connection 1 and the common juncture 27. The gate of the P-type transistor TP2 of the first switch 31 and the gate of the N-type transistor TN6 of the second switch 32 are connected together and to a first control input connection C0. The gate of the N-type transistor TN5 of the first switch 31 and the gate of the P-type transistor TP1 of the second switch 32 are connected in common to a second control input connection corresponding to the complementary value of C0.

The first level of switching action in the selector element is effected by placing a relatively high control voltage at the first control input connection C0 and a relatively low control voltage at the second control input connection receiving the complementary value of C0. These voltages applied to the respective gates cause the transistors TP2 and TN5 of the first switch 31 to be biased to the nonconducting or OFF condition, thus presenting an open switch between the input connection 2 and the juncture 27. These control voltages bias the transistors TP1 and TN6 of the second switch 32 to the conducting or ON condition, thus providing a closed switch between the input connection 1 and the juncture 27.

Alternatively, when the control voltage at the first control input connection C0 is low and the control voltage at the second control input connection receiving the complementary value of C0 is high, transistors TP1 and TN6 of the second switch 32 are biased to provide an open condition between input connection 1 and juncture 27, while transistors TP2 and TN5 of the first switch 31 are biased to provide a closed condition between input connection 2 and juncture 27. In summary, when C0 is +5 V (complementary value of C0 is 0 V), the switch having transistors TN6 and TP1 is turned ON, and the switch having transistors TN5 and TP2 is turned OFF, thus connecting input 1 to node 27. The opposite transistor conditions result when the true value of C0 is 0V and the complementary value is +5 V.

The second level of switching action in the selector element of FIG. 3 is performed by NAND circuit 30, wherein transistors TP3, TP4, TN7, and TN8 form a 2-input NAND gate. When the C1 input at node 8 is +5 V (whether as the true or complementary value), input 1 or input 2 appears at the output (depending upon which input was selected by pass-transistor element 33). When the C1 input is 0 V, the output is forced to +5 V regardless of the input selected by element 33. The sizes of transistors TP4 and TN8 were designed to optimize the speed from node 3 to the output.

As shown in FIG. 2, the configuration for stages no. 2–5 is basically a 3-input NAND gate with one of the inputs used for control. Although the switch implementation disclosed herein includes NAND gates, this should not be construed as a limitation of the present invention since other switch configurations may be developed which employ circuit elements other than NAND gates. A circuit schematic of a representative NAND gate is shown in FIG. 4. Transistors TP6 and TN5 are preferably designed to optimize speed for inputs 1 and 2. When the control signal is at a HIGH value (+5 V), the circuit functions as a NAND gate for inputs 1 and 2. Alternatively, when the control signal is at a LOW value (0 V), the output is forced to +5 V regardless of the input states.

The NAND stages are used because they provide the optimum speed in CMOS technology. The first stage is an exception, where pass-transistors are used for input selection. Although this pass-transistor configuration for stage no. 1 is slower than would be for a NAND gate implementation, it was used to simplify interconnection within the 64×1 module. By doing this, two levels of selection are performed by one stage. Since stage-1 contributes the largest number of gates, this approach resulted in minimum area.

FIG. 5 is a circuit schematic of an output buffer or driver circuit 35 corresponding to an inverter element which includes a P-type MOS field effect transistor TP1 connected between a voltage source of +5 volts and the output connection 36 and an N-type MOS field effect transistor TN2 connected between the output connection 36 and ground. The gates of the two transistors TP1 and TN2 are connected in common to the juncture 37.

In the block diagram of FIG. 2, stages no. 1–5 preferably utilize minimum size transistors for reducing chip area and power dissipation. The minimum size transistor stages are capable of driving similar stages having input capacitances on the order of 0.05 pF. In order to drive off-chip, where the capacitance is on the order of 5 pF, an output buffer is required. Such a buffer is formed by cascading inverters that utilize progressively larger transistors (formed by connecting smaller transistors in parallel). This was done to prevent the speed deterioration due to the distributed RC in the gates of large transistors.

In order to maximize the data rate, the transistor sizes are preferably increased gradually. The increase in transistor size is started by doubling the sizes of the transistors in the second inverter at the output of stage-5. The transistor increase factor is indicated by 2X on the circuit diagram of FIG. 2. Stage-6 is made 4X. The first stage of the six stage buffer (shown to the right of FIG. 2) is 6X and is physically located next to stage-6 of the switch. The second stage of the buffer is also 6X. The same transistor size was maintained to compensate for the relatively long physical separation between stage-1 and stage-2 of the buffer. The remaining buffer stages keep increasing by a factor of two until the last stage reaches 64X. Computer simulation indicated that this buffer design is capable of 200 Mb operation with a 10 pF load.

The 64×1 module has many levels of symmetry and modularity, as shown in FIG. 2. The smallest module is two stage-1s driving a stage-2. The next higher level of modularity is two stage-2s driving a stage-3. The outputs of stage-3s are combined in a stage-4 by making the right side a mirror image of the left side, which forms a 16×1 and feeds the left input of stage-5 (NAND gate 25). A mirror image of the 16×1 feeds the right input of stage-5, whose output is the upper input of stage-6 via two inverters. The lower input of stage-6 is supplied from a 32×1, which is a mirror image of the upper 32×1. This technique of modularity and symmetry immensely simplified the design, simulation, and layout. It also equalizes the delays from each input to the output to a fraction of a nanosecond.

Figure 6:
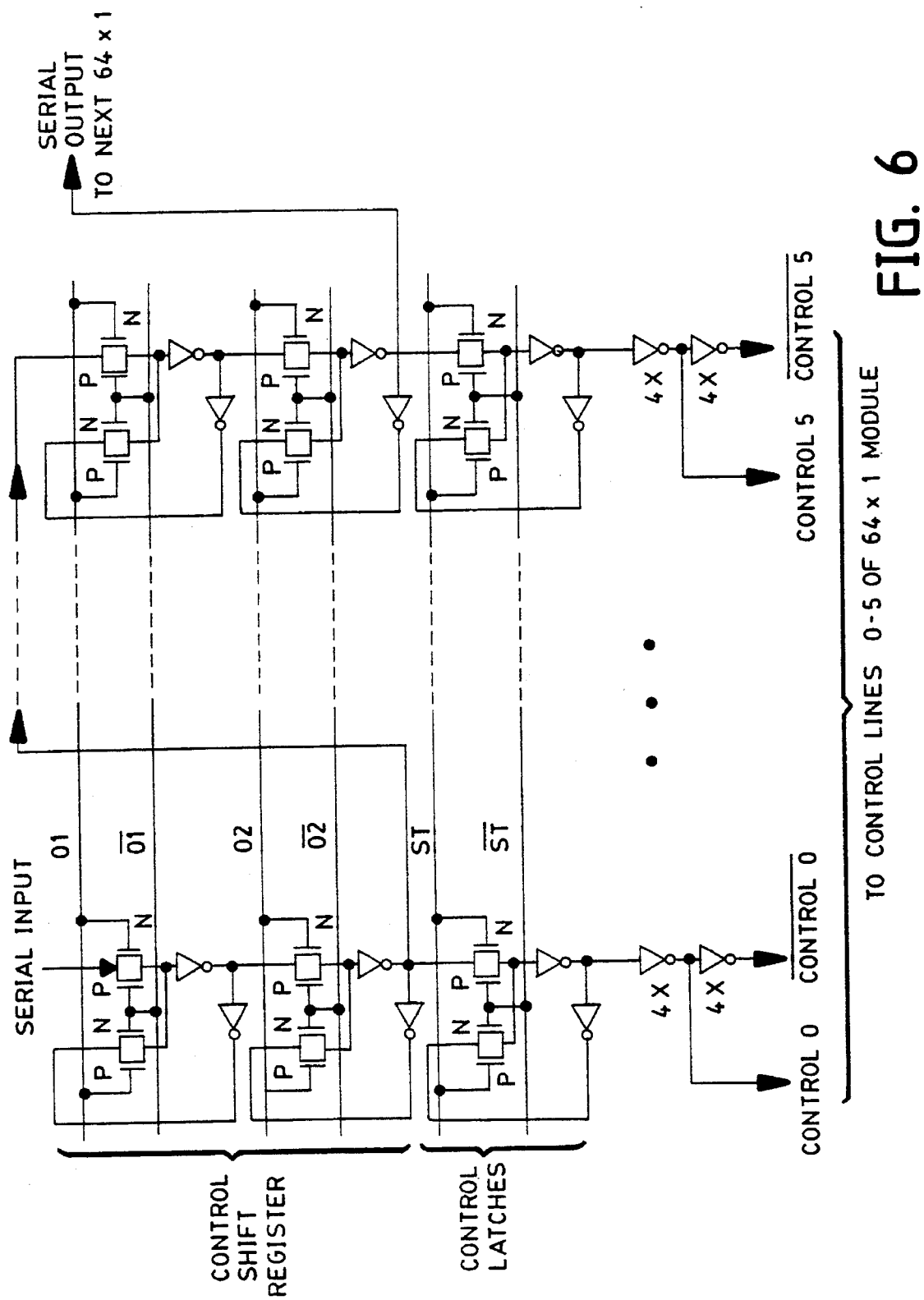
FIG. 6 is a circuit diagram of a distributed switching control assembly in accordance with a preferred embodiment of the present invention.

FIG. 6 illustrates a preferred implementation of the control unit for the 64×1 switch module in FIG. 2 supplying control signals C0×C5. The control unit includes a 6-bit shift register with serial-to-parallel conversion. The six parallel bits are loaded into six latches when the strobe pulse ST is applied. The latches provide the 12 true and complementary control lines and the capacitive drive. In the expanded space array configuration discussed infra in connection with FIG. 7 wherein sixteen of the FIG. 2 switch modules are connected in parallel to provide a 64×16 matrix, the serial shift register output from module N is directly applied to serial input of module N+1.

Figure 7:
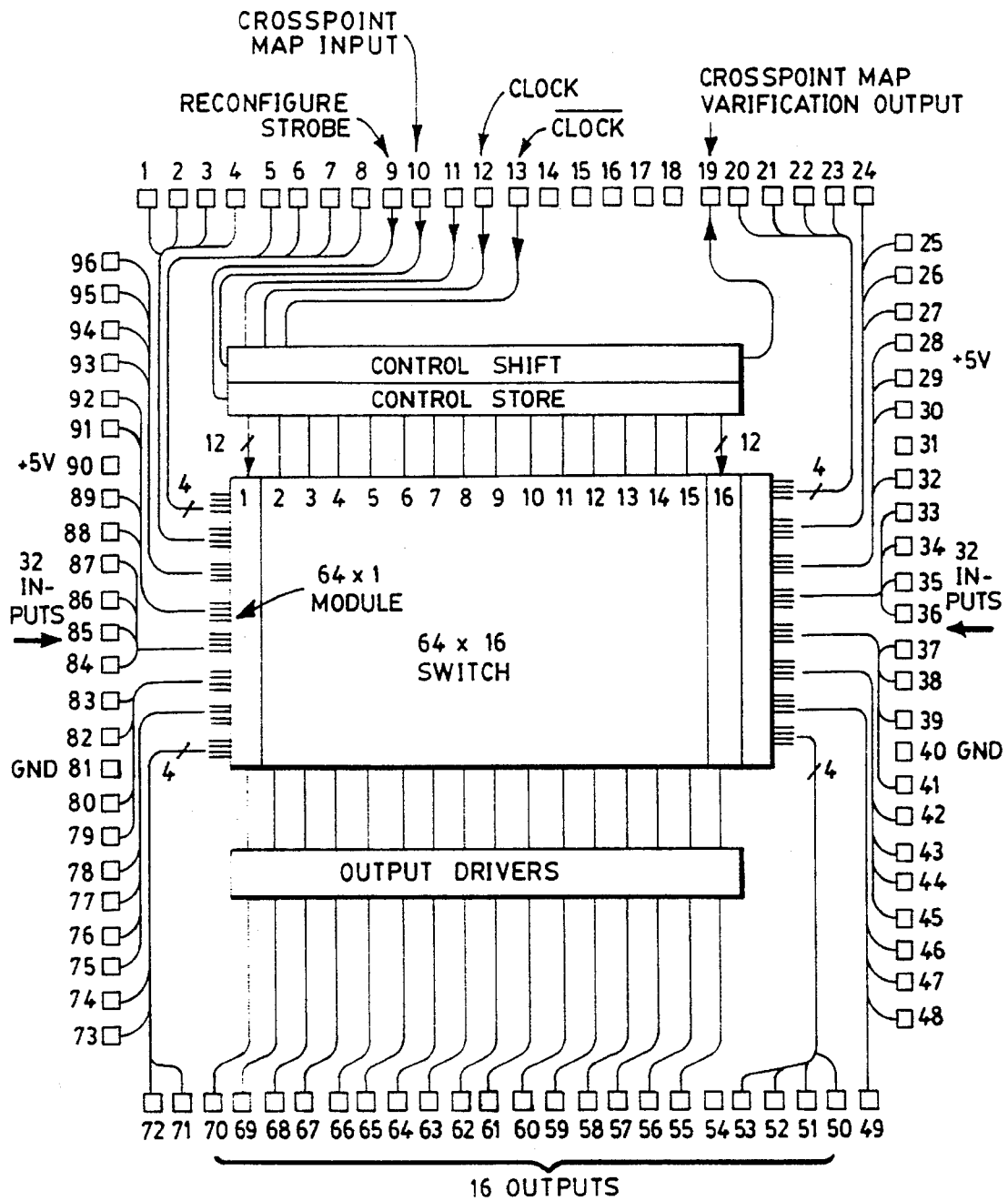
FIG. 7 is a circuit layout of a broadband switch architecture in accordance with a preferred embodiment of the present invention.

FIG. 7 shows a circuit layout of a 64×16 space switch matrix in accordance with a preferred embodiment of the present invention. The matrix chip includes sixteen of the 64×1 switch modules from FIG. 2 connected in parallel. Accordingly, the chip is organized into 64×1 modules, each of which contains an output driver and its own control storage. The 64 inputs are supplied from both sides, (i.e., 32 inputs from the right and 32 inputs from the left). These 64 common input lines run horizontally across the chip using metal layer #2. Also, the +5 supply voltage and ground are supplied from the right and left sides of the chip. The output from each 64×1 connects to a driver located at the bottom of the 64×1 module.

Various considerations dictated that the 64×16 space matrix should be formed by tall and slim 64×1 modules. One of the most important considerations was allowing room for connecting 64 inputs. The other consideration was simplifying and reducing design effort. This symmetry also simplified design, simulation, and layout at the global level since a 64×1 layout can easily be made into a 64×1 or any other number of outputs allowed by chip area and package pins. In order to maintain this design philosophy, the control shift register, control store and output driver was designed into each 64×1 module.

Each 64×1 module is controlled by six bits, which produce $2^6$=64 combinations. Both true and complementary controls are required, resulting in 12 control lines. The complementary control lines are generated on chip, therefore only six control bits need to be supplied externally to control each 64×1 module. For 16 modules, 16×6=96 control bits are required. In order to conserve package pins, the 96 control bits are supplied serially to the shift register, which converts the control to a parallel format and stores the code in 96 latches. The latches provide buffering and create the complementary control lines. The 12 control lines to each 64×1 module are connected vertically using metal 1. The shift register uses two externally supplied clock phases for clocking in the 96 control bits. A control bit can be read in every 100 ns, thus 100 ns×96=9.6 µs is required to read in a control word. As a new control word is read in, the latches hold the old control information so that the switching is not disrupted.

The control shift register and control store for the 64×16 is distributed among the 16 modules so that each module has its own independent control. When modules are assembled, the control shift and control store are automatically interconnected.

The shift register and the control latches are implemented with static logic so that the old control and the new control information can be stored indefinitely. At any time after the new control information is in the shift register, the shift register contents can be transferred in parallel to the 96 latches with a strobe pulse (ST). This operation requires 30 ns. Thus, the entire 64×16 switch is reconfigured 30 ns after the ST pulse is applied, and the newly reconfigured outputs become valid at the 16 output pins. The serial shift register output is made available off chip. This was done to verify that the correct control information is in the shift register. This verification can be done in several ways.

1. After the control information is written into the shift register, it can be recirculated and verified for correctness.
2. The control information can be written twice and the shift register output compared to the second write operation.
3. The shift register can be read out after it is transferred to the latches. This erases the shift register contents, but it has the advantage of not requiring a second write operation when reconfiguration speed is critical.

It is important to note two reconfiguration delays:
1. The delay from supplying the new control word to the appearance of new outputs is about 10 μs.
2. The delay from supplying the strobe (ST) to the appearance of new outputs is 30 ns.

The first situation is encountered when the 64×16 is employed in circuit switching, where 10 μs will be added to the call setup time. The second situation is applicable when the 64×16 switch is used in packet switching of packets longer than 10 microseconds. Here the control information can be pipelined. That is, while one packet is switched, a second packet header can be decoded and read in serially. Under these conditions, only 30 ns is needed to reconfigure for a new packet. A similar situation would be applicable in time switching.

The chip has been designed in 3-μm CMOS and operates in excess of 150 Mb/s. The chip is made up of 16 modules, each containing a 64×1 tree which is controlled with the parallel outputs of a 6-bit shift register located on top of the module. The 16 output drivers are at the bottom of the modules. The +5 V and ground lines are supplied from both sides with heavy on-chip busses to minimize voltage drops. These voltage drops produce crosstalk because they add to all outputs.

A summary of the technical features of the 64×16 space matrix is presented in the following specification table.

| Input Ports | 64 |
|---|---|
| Output Ports | 16 |
| No. Crosspoints | 1024 |
| Bit Rate | 150 Mb/s |
| Control | Serial-one input line, one output line |
| Reconfiguration | 1–10 μs to load control word 30 ns to execute |
| Delay Input to Output | 25 ns |
| Input Levels | |
| (0 in.) | 0 V |
| (1 in.) | +5 V |
| Output load | 10 pF |
| Output Level | |
| (0 in.) | 0 V |
| (1 in.) | +5 V |
| Power Supply | +5 V |
| Technology | 3 μm CMOS |
| Package | 108 pin grid array |
| Chip size | 4.6 mm × 6.8 mm |
| Package Size | 1.2" × 1.2" |

While there has been shown and described herein what are presently considered the preferred embodiments of the invention, it will be obvious to those skilled in the art that various changes and modifications can be made therein without departing from the scope of the invention as defined by the appended claims.

We claim:

1. A switch, comprising:
    a plurality of switching means configured as a multistage tree-multiplexer wherein a first stage of said tree-multiplexer receives input signals, and a last stage includes a single switching means coupled to an output port;
    each of said switching means having a plurality of signal inputs, an output, and a control input means;
    each switching means in said first stage further comprises:
        a pass-transistor selection means having a control input coupled to the respective control input means of said switching means, a plurality of signal inputs each coupled to receive a respective input signal, and an output;
        each of said selection means being responsive to said respective control input for selectively switching a signal from a selected one of said signal inputs to the output of said selection means;
    wherein the output of each switching means before the last stage drives a respective input of a switching means in the immediately following stage, and the output of the single switching means in said last stage is coupled to said output port;
    each of said switching means after the first stage being operable in a blocking state to force the output of said switching means to a predetermined steady-state logic value in response to a first control signal at the respective control input means; and
    each of said switching means after the first stage being operable in an unblocking state to selectably switch a signal from a selected input of said switching means to the output of said switching means in response to a second control signal at the respective control input means, and in response to output signals from switching means in the preceding stage which are in said blocking state.

2. The switch as recited in claim 1 wherein:
    each of said switching means after the first stage includes a NAND gate;
    said first control signal is a logical LOW state signal;
    said second control signal is a logical HIGH state signal; and
    said predetermined steady-state logic value is a HIGH state signal.

3. A switch, comprising:
    a plurality of switching means configured as a multistage tree-multiplexer wherein a first stage of said tree-multiplexer receives input signals, and a last stage includes a single switching means coupled to an output port;

each of said switching means having a plurality of signal inputs, an output, and a control input means;

each switching means in said first stage further comprises:
- a pass-transistor selection means having a control input coupled to the respective control input means of said switching means, a plurality of signal inputs each coupled to receive a respective input signal, and an output;
- each of said selection means being responsive to said respective control input for selectively switching a signal from a selected one of said signal inputs to the output of said selection means;

wherein the output of each switching means before the last stage drives a respective input of a switching means in an immediately following stage, and the output of the single switching means in said last stage is coupled to said output port;

each of said switching means after the first stage being operable in response to a first control condition at the respective control input means to force the output of said switching means to a predetermined steady-state logic value; each of said switching means after the first stage being operable in response to a second control condition at the control input means, and to predetermined steady-state logic value signals received from the preceding stage at signal inputs other than a selected signal input, to provide a switching path from the selected signal input to the output of said switching means.

4. The broadband switch as recited in claim 3 wherein:

each of said switching means after the first stage includes a NAND gate;

said first control signal is a logical LOW state signal;

said second control signal is a logical HIGH state signal; and said predetermined steady-state logic value is a HIGH state signal.

* * * * *